(12) United States Patent
Ishikawa

(10) Patent No.: US 12,727,210 B2
(45) Date of Patent: Sep. 1, 2026

(54) SEMICONDUCTOR DEVICE

(71) Applicant: FUJI ELECTRIC CO., LTD., Kanagawa (JP)

(72) Inventor: Takamasa Ishikawa, Matsumoto-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 366 days.

(21) Appl. No.: 18/516,953

(22) Filed: Nov. 22, 2023

(65) Prior Publication Data

US 2024/0234493 A1 Jul. 11, 2024

(30) Foreign Application Priority Data

Jan. 5, 2023 (JP) ................................ 2023-000756

(51) Int. Cl.
*H10D 62/10* (2025.01)
*H10D 8/60* (2025.01)
*H10D 12/00* (2025.01)

(52) U.S. Cl.
CPC ............. *H10D 62/105* (2025.01); *H10D 8/60* (2025.01); *H10D 12/481* (2025.01)

(58) Field of Classification Search
CPC .. H10D 12/481; H10D 62/105; H10D 62/127; H10D 62/393; H10D 62/53; H10D 62/60; H10D 62/8325; H10D 64/117; H10D 8/422; H10D 8/60
See application file for complete search history.

(56) References Cited

U.S. PATENT DOCUMENTS

| | | | | |
|---|---|---|---|---|
| 2016/0005844 | A1 * | 1/2016 | Kimura ................ | H10D 84/617 257/140 |
| 2018/0108737 | A1 * | 4/2018 | Naito ................... | H10D 84/811 |
| 2019/0267370 | A1 * | 8/2019 | Sato ..................... | H10D 84/406 |
| 2020/0185520 | A1 * | 6/2020 | Imagawa ............. | H10D 30/668 |
| 2022/0271152 | A1 * | 8/2022 | Mitsuzuka ............. | H10D 8/422 |
| 2022/0328669 | A1 * | 10/2022 | Mitsuzuka ........... | H10D 64/117 |
| 2023/0036039 | A1 | 2/2023 | Matsui | |

FOREIGN PATENT DOCUMENTS

| | | | |
|---|---|---|---|
| JP | H09121062 | A | 5/1997 |
| JP | 2017168829 | A | 9/2017 |
| JP | 2023019322 | A | 2/2023 |
| WO | 2014125584 | A1 | 8/2014 |
| WO | 2019176327 | A1 | 9/2019 |

* cited by examiner

*Primary Examiner* — Shaun M Campbell

(57) ABSTRACT

The diode portion includes: a plurality of trench portions, a drift region of a first conductivity type, an anode region of a second conductivity type provided above the drift region and having a doping concentration higher than that of a base region; and a second conductivity type region provided on the front surface of the semiconductor substrate above the anode region and having a doping concentration higher than that of the anode region, and the diode portion includes a Schottky junction region in which the anode region is provided on the front surface of the semiconductor substrate and an Ohmic junction region in which the anode region and the second conductivity type region are provided on the front surface of the semiconductor substrate.

19 Claims, 7 Drawing Sheets

100

1100

SEMICONDUCTOR DEVICE

The contents of the following patent application(s) are incorporated herein by reference: NO. 2023-000756 filed in JP on Jan. 5, 2023

BACKGROUND

1. Technical Field

The present invention relates to a semiconductor device.

2. Related Art

Patent Literature 1 discloses a semiconductor device provided with an IGBT region and a diode region in the same semiconductor substrate.

PRIOR ART LITERATURE

Patent Literature

Patent Literature 1: PCT International Publication No. 2014/125584

DESCRIPTION OF EXEMPLARY EMBODIMENTS

Figure 1A:
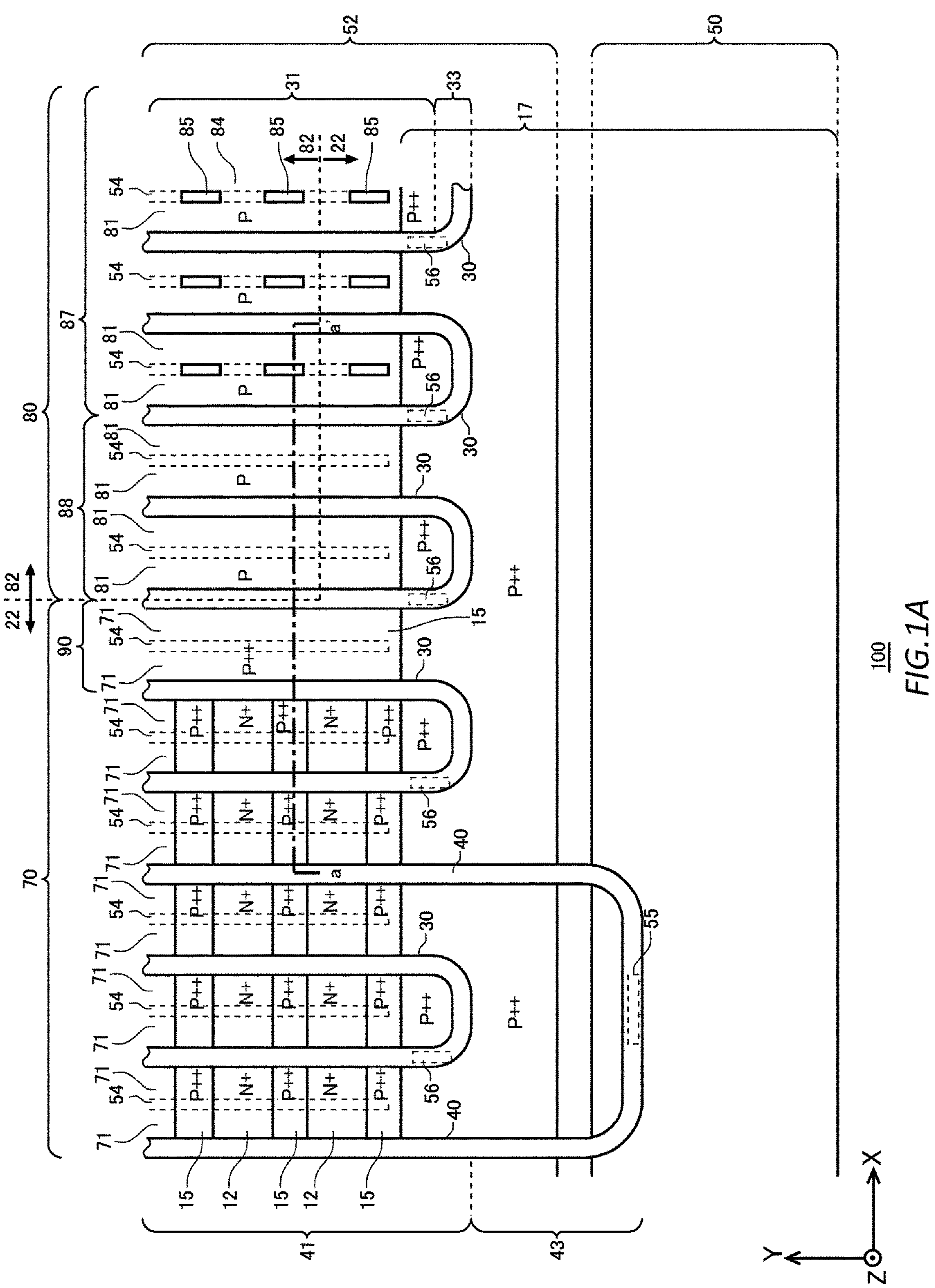
FIG. 1A shows an example of a top view of a semiconductor device 100 according to the example.

Hereinafter, the present invention will be described through embodiments of the invention, but the following embodiments do not limit the invention according to claims. In addition, not all of the combinations of features described in the embodiments are essential to the solution of the invention.

In the present specification, one side in a direction parallel to a depth direction of a semiconductor substrate is referred to as an "upper" side, and another side is referred to as a "lower" side. One surface of two principal surfaces of a substrate, a layer, or other member is referred to as a front surface, and the other surface is referred to as a back surface. "Upper", "lower", "front", and "back" directions are not limited to a direction of gravity, or a direction of an attachment to a substrate or the like when a semiconductor device is mounted.

In the present specification, technical matters may be described using orthogonal coordinate axes of an X axis, a Y axis, and a Z axis. As used herein, a plane parallel to a front surface of a semiconductor substrate will be referred to as an XY plane, and a depth direction of the semiconductor substrate will be referred to as the Z axis. It should be noted that in the present specification, a case where the semiconductor substrate is viewed in a Z axis direction is referred to as a top view.

Each example embodiment shows an example in which a first conductivity type is set as an N type, and a second conductivity type is set as a P type; however, the first conductivity type may be the P type, and the second conductivity type may be the N type. In this case, conductivity types of the substrate, the layer, a region, and the like in each example embodiment respectively have opposite polarities.

In the present specification, a character N or P specifying a layer or a region means that electrons or holes are majority carriers, respectively. In addition, each of a symbol "+" and a symbol "−" added to N or P represents a layer or a region of a higher doping concentration and a lower doping concentration than that of a layer or a region without the symbol, and a symbol "++" represents a higher doping concentration than "+" while a symbol "−−" represents a lower doping concentration than "−".

In the present specification, a doping concentration refers to a concentration of a donor or a dopant that has turned into an acceptor. Therefore, the unit is $/cm^3$. In the present specification, a difference in concentration (that is, a net doping concentration) between the donor and the acceptor may be set as the doping concentration. In this case, the doping concentration can be measured in an SRP method. In addition, a chemical concentration of the donor and the acceptor may also be set as the doping concentration. In this case, the doping concentration can be measured by a SIMS method. If not particularly limited, any of the above may be used as the doping concentration. If not particularly limited, a peak value of a doping concentration distribution in a doping region may be set as the doping concentration in the doping region.

In addition, as used herein, a dosage refers to the number of ions implanted in a wafer per unit area when ions are implanted. Therefore, the unit is $/cm^2$. Note that a dosage of a semiconductor region can be taken as an integral concentration which is obtained by integrating doping concentrations across the semiconductor region in the depth direction. The unit of the integral concentration is $/cm^2$. Therefore, the dosage may be treated as the same as the integral concentration. The integral concentration may also be set to be an integral value within a half-value width. In the case of being overlapped by spectrum of another semiconductor region, the integral concentration may be derived without the influence of another semiconductor region.

Therefore, as used in the present specification, the level of the doping concentration can be read as the level of the dosage. That is, if the doping concentration of one region is higher than the doping concentration of another region, it can be understood that the dosage of the one region is higher than the dosage of the another region.

FIG. 1A shows an example of a top view of a semiconductor device 100 according to the example. The semiconductor device 100 is provided with the semiconductor substrate having the transistor portion 70 including a transistor element such as an IGBT and the diode portion 80 including a diode element such as a free wheel diode (FWD). For example, the semiconductor device 100 is a reverse conducting IGBT (RC-IGBT).

Note that, in the present specification, when simply referred to as a top view, it means viewing from the front surface side of the semiconductor substrate. In the present example, an arrangement direction of the transistor portion 70 and the diode portion 80 in a top view is referred to as an X axis, a direction perpendicular to the X axis on the front surface of the semiconductor substrate is referred to as a Y axis, and a direction perpendicular to the front surface of the semiconductor substrate is referred to as a Z axis.

Each of the transistor portion 70 and the diode portion 80 may have a longitudinal length in an extending direction. In other words, the length of each of the transistor portions 70 in the Y axis direction is larger than the width in the X axis direction. Similarly, the length of each of the diode portions 80 in the Y axis direction is larger than the width in the X axis direction. The extending direction of the transistor portion 70 and the diode portion 80, and the longitudinal direction of each trench portion described below may be the same.

The transistor portion 70 is a region where the collector region 22 provided on the back surface side of the semiconductor substrate is projected onto a front surface of the semiconductor substrate. The collector region 22 of the present example is, for example, of the P type. The transistor portion 70 includes transistors such as IGBTs.

The transistor portion 70 includes emitter regions 12 of the N type, contact regions 15 of the P type, and gate trench portions 40 each having a gate conductive portion and a gate dielectric film which are cyclically located on the front surface of the semiconductor substrate. As used herein, the front surface side of the semiconductor substrate may mean the front surface side compared to the center of the semiconductor substrate in the Z axis direction.

The diode portion 80 is a region where the cathode region 82 provided on the back surface side of the semiconductor substrate is projected onto the front surface of the semiconductor substrate. The cathode region 82 of the present example is, for example, of the N type. The diode portion 80 includes a diode such as a free wheel diode (FWD) provided so as to be adjacent to the transistor portion 70 on the front surface of the semiconductor substrate. On the back surface of the semiconductor substrate, a collector region of P type may be provided in a region other than the cathode region.

The semiconductor substrate may be a silicon substrate, a silicon carbide substrate, or a nitride semiconductor substrate and so forth of gallium nitride or the like. The semiconductor substrate of the present example is a silicon substrate.

The semiconductor device 100 of the present example includes a gate trench portion 40, a dummy trench portion 30, an emitter region 12, a contact region 15, a well region 17, an anode region 84, and a second conductivity type region 85 provided on the front surface of the semiconductor substrate. The gate trench portion 40 and the dummy trench portion 30 each are an example of the trench portion.

In addition, the semiconductor device 100 in the present example includes a gate metal layer 50 and an emitter electrode 52 which are provided above the front surface of the semiconductor substrate. Although an interlayer dielectric film is provided between the emitter electrode 52 and the gate metal layer 50, and the front surface of the semiconductor substrate, it is omitted in FIG. 1A. In the interlayer dielectric film of the present example, contact holes 54, 55, and 56 are provided to extend through the interlayer dielectric film. In FIG. 1A, each contact hole is illustrated by dashed lines.

The emitter electrode 52 is provided above the gate trench portion 40, the dummy trench portion 30, the emitter region 12, the contact region 15, the well region 17, the anode region 84, and the second conductivity type region 85. The emitter electrode 52 is electrically connected to the emitter region 12, the contact region 15, the anode region 84, and the second conductivity type region 85 on the front surface of the semiconductor substrate through the contact hole 54.

The emitter electrode 52 and the gate metal layer 50 are formed of a material including metal. At least a part of a region of the emitter electrode 52 may be formed of aluminum, or alloy of which main component is aluminum (for example, aluminum-silicon alloy, aluminum-silicon-copper alloy, or the like). At least a part of a region of the gate metal layer 50 may be formed of aluminum, or alloy of which main component if aluminum (for example, aluminum-silicon alloy, aluminum-silicon-copper alloy, or the like). Further, plating layers may also be provided on the front surface of the emitter electrode 52 and the gate metal layer 50.

The emitter electrode 52 and the gate metal layer 50 may include a barrier metal formed of titanium, titanium compound, or the like under the region formed of aluminum and the like. The emitter electrode 52 and the gate metal layer 50 are provided separately from each other.

The contact hole 55 connects gate conductive portions within the gate trench portions 40 in the transistor portion 70 to the gate metal layer 50. In the contact hole 55, a plug formed of tungsten or the like may be provided via a barrier metal.

The contact hole 56 connects the transistor portion 70 and the dummy conductive portion within the dummy trench portion 30 provided in the diode portion 80 with the emitter electrode 52. In the contact hole 56, a plug formed of tungsten or the like may be provided via a barrier metal.

The gate trench portion 40 is arranged at a predetermined interval along a predetermined arrangement direction (the X axis direction in the present example). The gate trench portion 40 of the present example may have: two extending portions 41 that extend along an extending direction (the Y axis direction in the present example) which is parallel to the front surface of the semiconductor substrate and which is perpendicular to the arrangement direction; and a connecting portion 43 that connects the two extending portions 41.

At least a part of the connecting portion 43 is preferably formed in a curved shape. By connecting end portions of the two extending portions 41 of the gate trench portions 40, an electric field strength at the end portions of the extending portions 41 can be reduced. At the connecting portion 43 of the gate trench portion 40, the gate metal layer 50 may be connected to the gate conductive portion.

The dummy trench portion 30 is a trench portion in which the dummy conductive portion is provided to be electrically connected to the emitter electrode 52. The dummy trench portion 30 is arranged, similarly to the gate trench portion 40, at a predetermined interval along a predetermined arrangement direction (the X axis direction in the present example). The dummy trench portion 30 in the present example may have, similarly to the gate trench portion 40, a U shape on the front surface of the semiconductor substrate. That is, the dummy trench portion 30 may include two extending portions 31, which extend along the extending direction, and the connecting portion 33, which connects two extending portions 31.

The transistor portion 70 in the present example has a repetitive arrangement structure of one gate trench portion 40 and two dummy trench portions 30. That is, the transistor portion 70 of the present example has the gate trench portions 40 and the dummy trench portions 30 at a ratio of 1:2. For example, in the transistor portion 70, two extending portions 31 are arranged between two adjacent extending portions 41 in the arrangement direction.

The ratio of the gate trench portions 40 and the dummy trench portions 30 is not limited to that of the present example. The ratio of the gate trench portions 40 and the dummy trench portions 30 may be 1:1, or may also be 2:3. Alternatively, the transistor portion 70 may also have a structure provided with the gate trench portions 40, but without the dummy trench portions 30.

The well region 17 is provided in the front surface side of the semiconductor substrate compared to the drift region 18 which will be described below. The well region 17 is an example of the well region provided in the edge side of the semiconductor device 100. The well region 17 is of a P++ type as an example. The well region 17 is provided across a predetermined area from an end of the side of the active region in which the gate metal layer 50 is provided.

A diffusion depth of the well region 17 may be deeper than depths of the gate trench portion 40 and the dummy trench portion 30. Partial regions of the gate trench portions 40 and the dummy trench portions 30 at the side of the gate metal layer 50 are provided in the well region 17. The bottoms of the ends of the gate trench portions 40 and the dummy trench portions 30 in the extending direction may be covered by the well region 17.

The contact hole 54 is provided above each region of the emitter region 12 and the contact region 15 in the transistor portion 70. The contact hole 54 is also provided above the anode region 84 and the second conductivity type region 85 in the diode portion 80. No contact holes 54 are provided above the well regions 17 provided at the both ends in the Y axis direction. In this way, the interlayer dielectric film is provided with one or more contact holes 54. The contact hole 54 of the present example may be provided to extend in the extending direction.

A mesa portion 71 and a mesa portion 81 are mesa portions provided so as to be adjacent to the trench portion in a plane parallel to the front surface of the semiconductor substrate. The mesa portion may be a portion of the semiconductor substrate, which is sandwiched by two adjacent trench portions, and may range from the front surface of the semiconductor substrate to a depth at the lowermost bottom of each trench portion. The extending portions of each trench portion may be regarded as one trench portion. That is, the region sandwiched between two extending portions may be set to be a mesa portion.

The mesa portion 71 is provided adjacent to at least one of the dummy trench portion 30 or the gate trench portion 40 in the transistor portion 70. The mesa portion 71 includes the well region 17, the emitter region 12, the base region 14, and the contact region 15 in the front surface side of the semiconductor substrate. The mesa portion 81 is provided to be adjacent to the dummy trench portion 30 in the diode portion 80. The mesa portion 81 includes the well region 17, the anode region 84, and the second conductivity type region 85 on the front surface of the semiconductor substrate.

The base region 14 is a region provided in the front surface side of the semiconductor substrate compared to the drift region 18 in the transistor portion 70. The anode region 84 is a region provided in the front surface side of the semiconductor substrate compared to the drift region 18 in the diode portion 80. For example, the base region 14 of the present example is of the P+ type and the anode region 84 is of the P type. The doping concentration of the anode region 84 of the present example is equal to or greater than 2.5E14 $cm^{-3}$ and equal to or smaller than 1E16 $cm^{-3}$. Note that, the E means 10 to the power of, and for example, 1E16 $cm^{-3}$ means $1\times10$ $cm^{-3}$. The doping concentration of the anode region 84 is lower than the doping concentration of the base region 14. In the present example, by lowering the doping concentration of the anode region 84, holes can be prevented from being injected during reverse recovery.

The emitter region 12 is a region of the same conductivity type as that of the drift region 18, having a doping concentration higher than that of the drift region 18. The emitter region 12 in the present example is of the N+ type as an example. An example of a dopant of the emitter region 12 includes arsenic (As). The emitter region 12 is provided to be in contact with the gate trench portion 40 on the front surface of the mesa portion 71. The emitter region 12 may be provided to extend in the X axis direction from one of two trench portions sandwiching the mesa portion 71 to the other of the two trench portions.

In addition, the emitter region 12 may or may not be in contact with the dummy trench portion 30. The emitter region 12 in the present example is in contact with the dummy trench portion 30. The emitter region 12 is not provided in the mesa portions 81.

The contact region 15 is a region of the same conductivity type as the base region 14 having a doping concentration higher than that of the base region 14. The contact region 15 of the present example is of the P++ type as an example. The contact region 15 of the present example is provided on the front surface of the mesa portion 71. The contact region 15 is provided to extend from one trench portion to the other trench portion of two trench portions with the mesa portion 71 interposed therebetween in the X axis direction. The transistor portion 70 of the present example includes the emitter regions 12 and the contact regions 15 on the front surface of the mesa portion 71 alternately provided in the Y axis direction. The contact region 15 is not provided in the mesa portion 81.

The transistor portion 70 may include a boundary region 90 at an end of the diode portion 80 side in a top view. The boundary region 90 is provided to prevent carriers from sneaking from the transistor portion 70 to the diode portion 80 during reverse recovery of the diode portion 80.

The mesa portion 71 of the boundary region 90 of the present example is not provided with the emitter region 12. The mesa portion 71 of the boundary region 90 may include the contact region 15 provided to extend in the Y axis direction. Alternatively, the mesa portion 71 of the boundary region 90 may include the contact regions 15 and the base regions 14 alternately provided in the Y axis direction in a top view.

The width of the boundary region 90 of the present example in the X axis direction is equal to or greater than 1.7 μm and equal to or smaller than 2.3 μm. As used herein, the width in the X axis direction refers to, provided that the region extends across one or more mesa portions, a distance between the centers of the trench portions in the X axis direction with which both ends of the one or more mesa portions are in contact. The width of the boundary region 90 in the X axis direction may be equal to or smaller than the width of one mesa portion 71.

The second conductivity type region 85 is a region of the same conductivity type as the anode region 84 having a doping concentration higher than that of the anode region 84. In the present example, the second conductivity type region 85 is of the P++ type, as an example. The doping concentration of the second conductivity type region 85 of the present example is equal to or greater than 1E16 $cm^{-3}$ and equal to or smaller than 1E19 $cm^{-3}$. The doping concentration of the second conductivity type region 85 of the present example is higher than the doping concentration of the contact region 15.

The diode portion 80 of the present example includes, in a top view, an Ohmic junction region 87 spaced apart from the transistor portion 70 and a Schottky junction region 88 provided between the Ohmic junction region 87 and the transistor portion 70.

The Ohmic junction region 87 is a region in which the Ohmic junction is formed between the semiconductor substrate and the emitter electrode 52. The Ohmic junction region 87 includes the anode region 84 and the second conductivity type region 85 provided on the front surface of the semiconductor substrate.

In the Ohmic junction region 87 of the present example, the second conductivity type regions 85 are discretely provided in the Y axis direction on the front surface of the mesa portion 81. In addition, the second conductivity type region 85 is provided to be spaced apart from the side wall of the dummy trench portion 30. In the Ohmic junction region 87, the second conductivity type region 85 is surrounded by the anode region 84 exposed to the front surface of the mesa portion 81.

The doping concentration of the second conductivity type region 85 is higher than the doping concentration of the contact region 15, and the doping concentration of the anode region 84 is lower than the doping concentration of the base region 14. In the present example, the Ohmic junction region 87 includes the second conductivity type regions 85 discretely provided on the front surface of the mesa portion 81 to ensure the Ohmic junction and is provided with the anode region 84 to reduce the total amount of holes in the diode portion 80 such that the hole injection can be suppressed during reverse recovery.

The Schottky junction region 88 is a region in which the Schottky junction is formed between the semiconductor substrate and the emitter electrode 52. The Schottky junction region 88 is provided at an end of the transistor portion 70 side of the diode portion 80 in a top view of the semiconductor substrate. The width of the Schottky junction region 88 of the present example in the X axis direction is equal to or smaller than 70 μm. The width of the Schottky junction region 88 in the X axis direction varies depending on the thickness of the semiconductor substrate 10, and is equal to or greater than 40 μm and equal to or smaller than 70 μm, for example, when the breakdown voltage is about 1200 V. The width of the Schottky junction region 88 in the X axis direction is greater than the width of the boundary region 90 in the X axis direction.

In the Schottky junction region 88 of the present example, the front surface of the mesa portion 81 is provided with the anode region 84. The Schottky junction region 88 may not be provided with the second conductivity type region 85. Alternatively, the Schottky junction region 88 may also include, in a top view, the second conductivity type region 85 discretely provided in the Y axis direction in the similar manner to the Ohmic junction region 87 at the ratio lower than in the Ohmic junction region 87.

The Schottky junction region 88 suppresses the hole injection without preventing the injection and withdrawal of electrons to reduce the injection efficiency of carriers such that the density of carriers in the semiconductor substrate can be reduced. In addition, the Schottky junction region 88 is provided at the end of the transistor portion 70 side to suppress holes injected from the transistor portion 70 and sneaking into the diode portion 80.

In this manner, the diode portion 80 is provided with the Ohmic junction region 87 and the Schottky junction region 88 such that the width of the boundary region 90 in the X axis direction can be smaller than the width of the Schottky junction region 88 in the X axis direction, thereby reducing the reverse recovery loss with a smaller invalid region such that the chip area can be smaller.

Figure 1B:
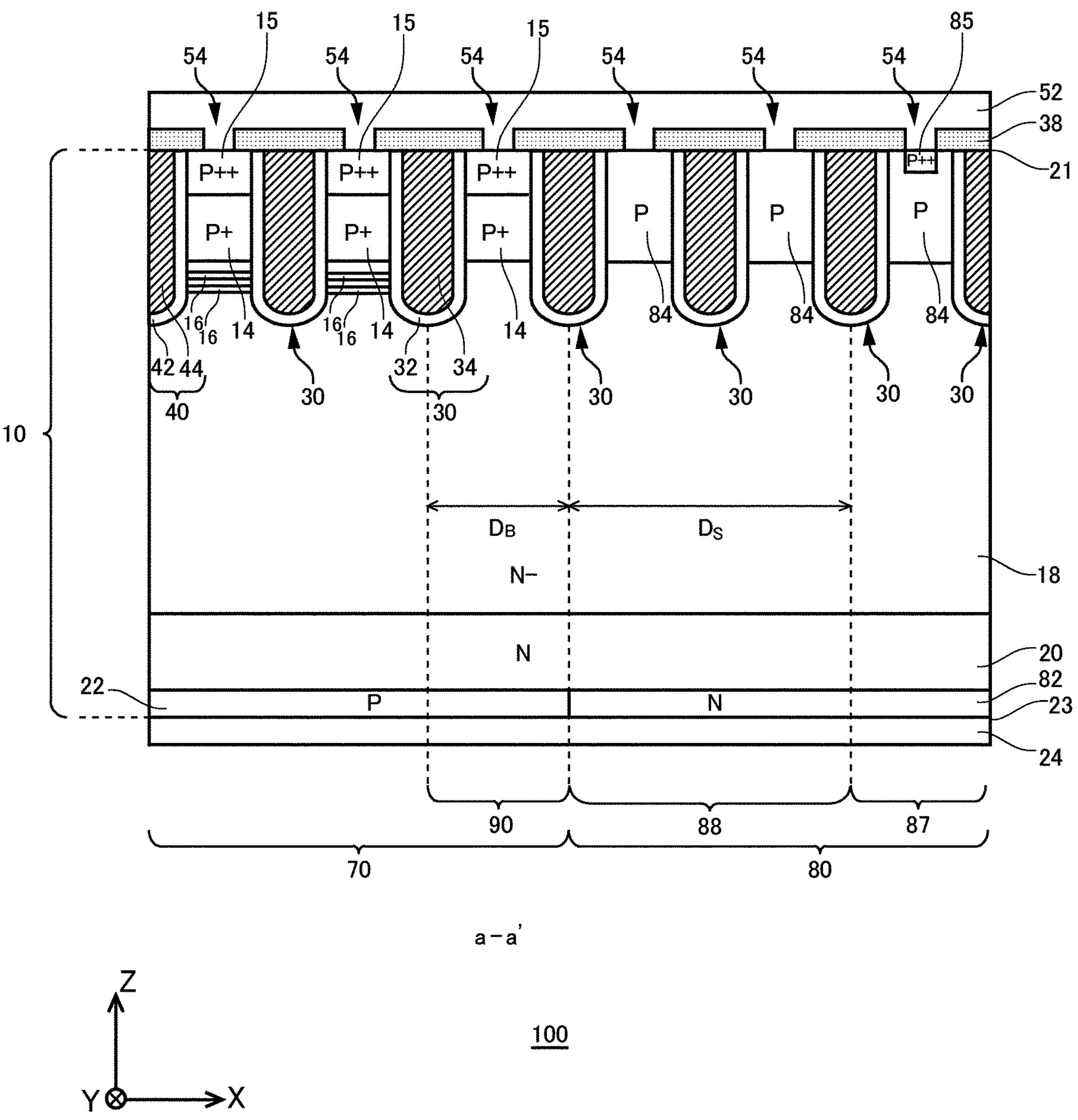
FIG. 1B is a diagram showing an example of the cross section taken along the line a-a' in FIG. 1A.

FIG. 1B is a diagram showing an example of the cross section taken along the line a-a' in FIG. 1A. The cross section taken along the line a-a' is an X-Z plane passing through the contact region 15 and the second conductivity type region 85.

The semiconductor device 100 of the present example includes the semiconductor substrate 10, an interlayer dielectric film 38, the emitter electrode 52 and a collector electrode 24. The emitter electrode 52 is provided above the semiconductor substrate 10 and the interlayer dielectric film 38.

The drift region 18 is a region provided in the semiconductor substrate 10. The drift region 18 in the present example is of the N-type as an example. The drift region 18 may be a region that has remained without other doping regions being formed in the semiconductor substrate 10. That is, the doping concentration of the drift region 18 may be a doping concentration of the semiconductor substrate 10.

The buffer region 20 is a region provided below the drift region 18. The buffer region 20 of the present example may be of the same conductivity type as that of the drift region 18, for example, be of N type. The doping concentration of the buffer region 20 is higher than the doping concentration of the drift region 18. The buffer region 20 may function as a field stop layer to prevent a depletion layer expanded from the lower surface sides of the base region 14 and the anode region 84 from reaching the collector region 22 and the cathode region 82.

The collector region 22 is a region which is provided below the buffer region 20 in the transistor portion 70 and which is of a conductivity type different from that of the drift region 18. The cathode region 82 is a region which is provided below the buffer region 20 in the diode portion 80 and which is of the same conductivity type as that of the drift region 18. The boundary between the collector region 22 and the cathode region 82 is a boundary between the transistor portion 70 and the diode portion 80.

The collector electrode 24 is provided on the back surface 23 of the semiconductor substrate 10. The collector electrode 24 is formed of a conductive material such as metal, or by stacking conductive materials.

The base region 14 is a region provided above the drift region 18 in the mesa portion 71 and of the conductivity type different from that of the drift region 18. The base region 14 of the present example is of the P+ type as an example. The base region 14 is provided to be in contact with the gate trench portion 40. The base region 14 may be provided to be in contact with the dummy trench portion 30.

The anode region 84 is a region provided above the drift region 18 in the mesa portion 81 of the diode portion 80 and of the conductivity type different from that of the drift region 18. The anode region 84 of the present example is, for example, of the P type. The doping concentration of the anode region 84 of the present example is equal to or greater than 2.5E14 $cm^{-3}$ and equal to or smaller than 1E16 $cm^{-3}$. The doping concentration of the anode region 84 is lower than the doping concentration of the base region 14. The anode region 84 is provided to be in contact with the dummy trench portion 30.

The emitter region 12 is provided between the base region 14 and the front surface 21 of the semiconductor substrate 10. The emitter region 12 of the present example is provided in the mesa portion 71 other than that of the boundary region 90 and not provided in the mesa portion 71 of the boundary region 90 and the mesa portion 81. The emitter region 12 is provided to be in contact with the gate trench portion 40. The emitter region 12 may or may not be in contact with the dummy trench portion 30.

The contact region 15 is provided between the base region 14 and the front surface 21 of the semiconductor substrate 10. The contact region 15 of the present example is provided in the mesa portion 71, but not provided in the mesa portion 81. The contact region 15 of the present example is provided alternately with the emitter region 12 in the Y axis direction in the mesa portion 71 of a region other than the boundary region 90 and provided to extend in the Y axis direction in the mesa portion 71 of the boundary region 90, in a top view. The contact regions 15 may be provided to be in contact with the gate trench portion 40 and the dummy trench portion 30.

The second conductivity type region 85 is provided between the anode region 84 and the front surface 21 of the semiconductor substrate 10. The second conductivity type region 85 of the present example is provided in the mesa portion 81 of the Ohmic junction region 87, but not provided in the mesa portion 71 and the mesa portion 81 of the Schottky junction region 88. The second conductivity type regions 85 of the present example are discretely provided in the Y axis direction in the mesa portion 81 of the Ohmic junction region 87, in a top view. The second conductivity type region 85 is provided to be spaced apart from the dummy trench portion 30 in the mesa portion 81 of the Ohmic junction region 87. The doping concentration of the second conductivity type region 85 of the present example is equal to or greater than 1E16 $cm^{-3}$ and equal to or smaller than 1E19 $cm^{-3}$. The doping concentration of the second conductivity type region 85 is higher than the doping concentration of the contact region 15.

When the diode portion 80 is brought into conduction, electron current flows from the cathode region 82 to the anode region 84. When the electron current reaches the anode region 84, conductivity modulation occurs and hole current flows from the anode region 84. In addition, electron currents diffusing from the cathode region 82 facilitates the hole injection from the contact region 15 of the transistor portion 70, thereby increasing the density of holes in the semiconductor substrate 10. This leads to an extension of time to disappearance of holes when the diode portion 80 is turned off, thereby increasing the reverse recovery peak current and increasing the reverse recovery loss.

A technique for preventing such hole current is known, in which a lifetime control region including lifetime killers is provided on the front surface side of the semiconductor substrate. For example, the lifetime killers are electron beams implanted to the entire semiconductor substrate or helium, an electron beam, proton or the like implanted to a predetermined depth thereof. The lifetime control region is crystal defect formed in the semiconductor substrate by implanting the lifetime killers. The lifetime control region facilitates electrons and holes, which are generated when a diode portion is brought into conduction, to be eliminated in recombination, and thus reduces reverse recovery losses.

In the present example, the lifetime control region including the lifetime killers is not provided on a front surface 21 side of the semiconductor substrate 10. In the present example, the mesa portion 81 includes the second conductivity type region 85 having a higher doping concentration and provided discretely and the anode region 84 having a doping concentration lower than the doping concentration of the base region 14 such that the hole injection can be suppressed during reverse recovery even if the lifetime control region is not provided.

In addition, in the present example, the Schottky junction region 88 is provided at the end of the transistor portion 70 side while the Ohmic junction region 87 spaced apart from the transistor portion 70 ensures the Ohmic junction to suppress holes injected from the transistor portion 70 and sneaking into the diode portion 80.

The width $D_B$ of the boundary region 90 of the present example in the X axis direction is equal to or greater than 1.7 μm and equal to or smaller than 2.3 μm. The width $D_S$ of the Schottky junction region 88 in the X axis direction is, for example, equal to or greater than 40 μm and equal to or smaller than 70 μm and varies depending on the thickness of the semiconductor substrate 10. In the X axis direction, the width $D_B$ of the boundary region 90 is smaller than the width $D_S$ of the Schottky junction region 88.

In this manner, the diode portion 80 is provided with the Ohmic junction region 87 and the Schottky junction region 88 to make the boundary region 90 which is an invalid region smaller while reducing the reverse recovery loss such that the chip area can be smaller.

The contact hole 54 is provided to extend through the interlayer dielectric film 38 in the depth direction (Z axis direction) of the semiconductor substrate 10 and electrically connects the emitter electrode 52 with the semiconductor substrate 10. A barrier metal formed of titanium, titanium compound or the like may be provided inside the contact hole 54. Further, a plug formed of tungsten or the like may be provided inside the contact hole 54 via the barrier metal.

The second conductivity type region 85 is provided below the contact hole 54. For example, the second conductivity type region 85 is formed by the ion implantation of dopants such as boron (B) from the lower end of the contact hole 54. In the X axis direction, the width of the second conductivity type region 85 may be equal to or greater than the width of the lower end of the contact hole 54.

The accumulation region 16 is a region provided below the base region 14. The accumulation region 16 of the present example is of the same conductivity type as that of the drift region 18, and is of N+ type, as an example. The accumulation region 16 of the present example is not provided in the boundary region 90 and the diode portion 80. In the Z axis direction, two or more stages of the accumulation regions 16 may be provided.

In addition, the accumulation region 16 is provided to be in contact with the gate trench portion 40. The accumulation region 16 may be or may not be in contact with the dummy trench portion 30. The doping concentration of the accumulation region 16 is higher than the doping concentration of the drift region 18. By providing the accumulation region 16, the carrier injection enhancement effect (IE effect) can be increased, and an ON voltage of the transistor portion 70 can be reduced.

One or more gate trench portions 40 and one or more dummy trench portions 30 are provided on the front surface 21 of the semiconductor substrate 10. Each trench portion is provided to extend from the front surface 21 of the semiconductor substrate 10 to the drift region 18 in the Z axis direction. For regions provided with at least any of the emitter region 12, the base region 14, the contact region 15, the accumulation region 16 and the anode region 84, each trench portion also extends through these regions to reach the drift region 18. The configuration of the portion extending through the doping region is not limited to the one manufactured in the order of forming the doping region and then forming the trench portion. The configuration of the trench portion extending through the doping region includes a configuration of the doping region being formed between the trench portions after forming the trench portion.

The gate trench portion 40 has a gate trench, a gate dielectric film 42, and the gate conductive portion 44 that are provided at the front surface 21 of the semiconductor substrate 10. The gate dielectric film 42 is provided to cover an inner wall of the gate trench. The gate dielectric film 42 may be formed by oxidizing or nitriding a semiconductor on the inner wall of the gate trench. The gate conductive portion 44 is provided inside the gate dielectric film 42 in the gate trench. The gate dielectric film 42 insulates the gate conductive portion 44 from the semiconductor substrate 10. The gate conductive portion 44 is formed of a conductive material such as polysilicon. The gate trench portion 40 is covered by the interlayer dielectric film 38 at the front surface 21 of the semiconductor substrate 10.

The gate conductive portion 44 includes, in the Z axis direction, a region opposing to the adjacent base region 14 at the side of the mesa portion 71 with the gate dielectric film 42 interposed therebetween. When a predetermined voltage is applied to the gate conductive portion 44, a channel is formed by an electron inversion layer in a surface layer of the base region 14 in contact with the gate trench.

The dummy trench portion 30 may have the same structure as the gate trench portion 40. The dummy trench portion 30 has a dummy trench, a dummy dielectric film 32, and a dummy conductive portion 34 which are provided in the front surface 21 side of the semiconductor substrate 10. The dummy dielectric film 32 is provided to cover an inner wall of the dummy trench. The dummy conductive portion 34 is provided in the dummy trench, and is provided inside the dummy dielectric film 32. The dummy dielectric film 32 insulates the dummy conductive portion 34 from the semiconductor substrate 10. The dummy trench portion 30 is covered with the interlayer dielectric film 38 on the front surface 21 of the semiconductor substrate 10.

The interlayer dielectric film 38 is provided to a front surface 21 of the semiconductor substrate 10. The emitter electrode 52 is provided above the interlayer dielectric film 38. The interlayer dielectric film 38 is provided with one or more contact holes 54 for electrically connecting the emitter electrode 52 and the semiconductor substrate 10 together. Similarly, the contact hole 55 and the contact hole 56 may be provided to extend through the interlayer dielectric film 38.

Figure 2A:
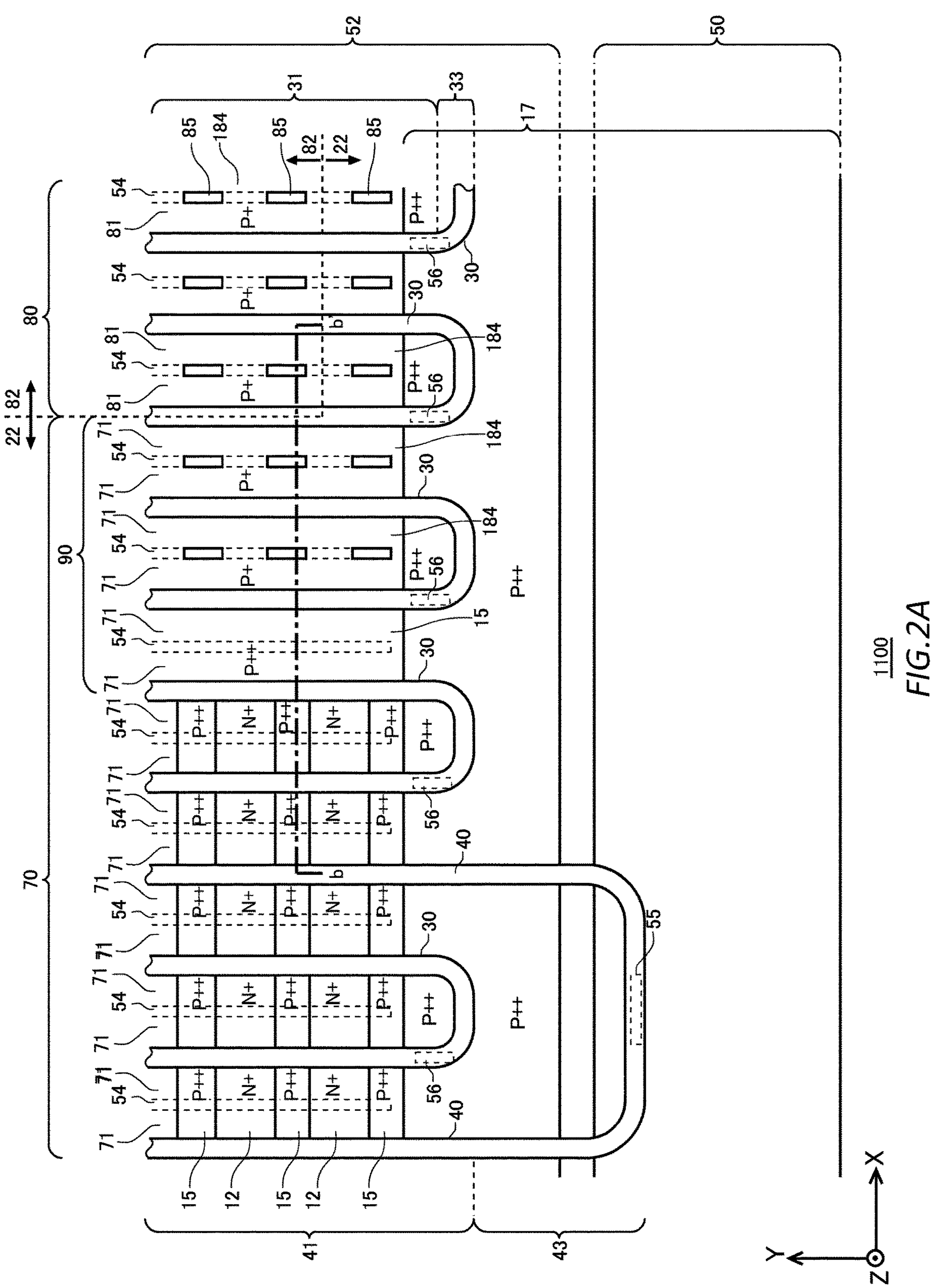
FIG. 2A shows an example of a top view of the semiconductor device 1100 according to a comparative example.
Figure 2B:
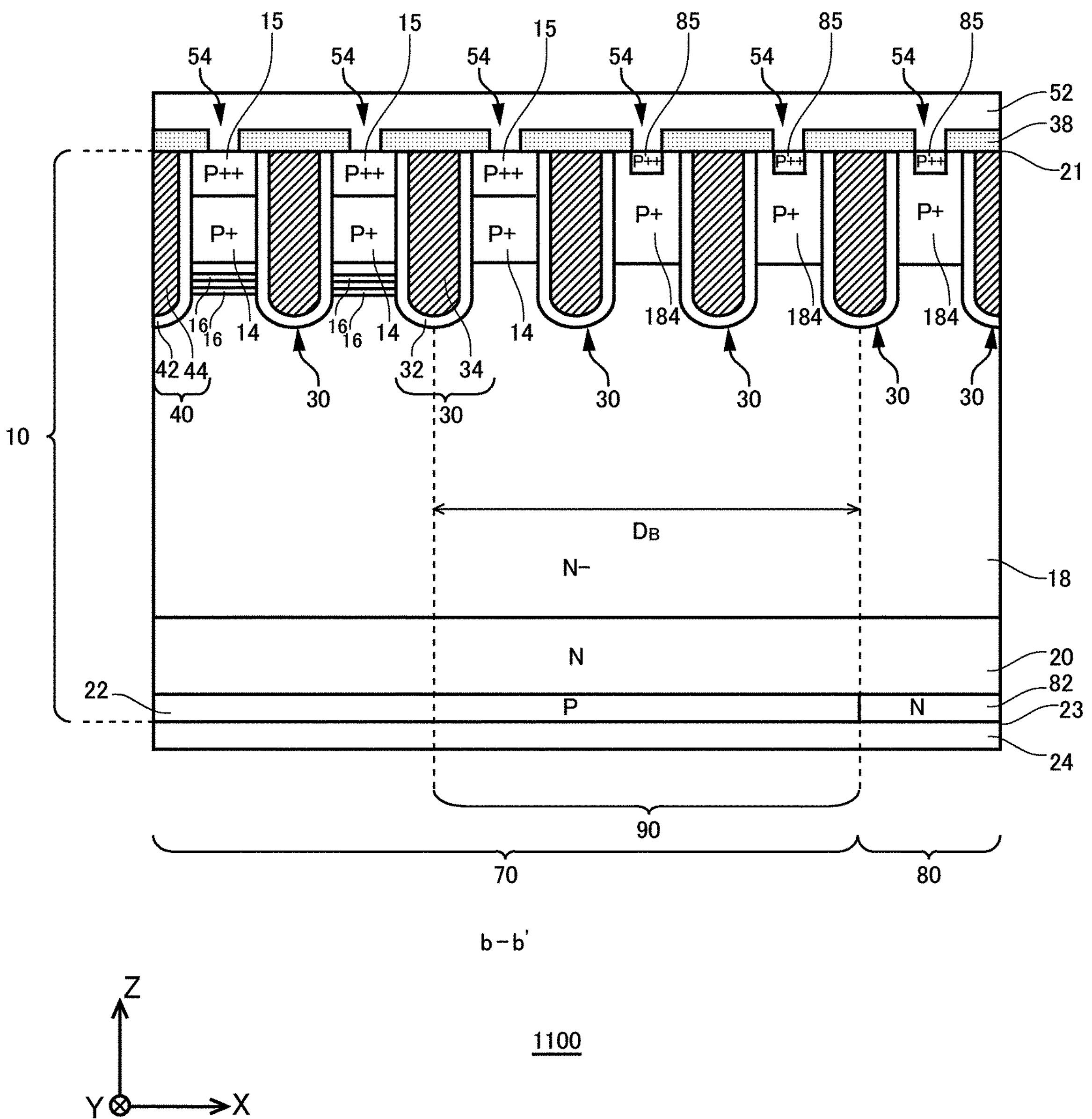
FIG. 2B is a diagram showing an example of the cross section taken along the line b-b' in FIG. 2A.

FIG. 2A shows an example of a top view of the semiconductor device 1100 according to a comparative example. FIG. 2B is a diagram showing an example of the cross section taken along the line b-b' in FIG. 2A. In the comparative example described herein, elements in common with the semiconductor device 100 according to the example are indicated by like reference numerals and descriptions of the common configurations will be omitted. In addition, the cross section taken along the line b-b' in FIG. 2A is an X-Z plane passing through the contact region 15 and the second conductivity type region 85, in the similar manner to the cross section taken along the line a-a' in FIG. 1A.

In the diode portion 80 of the semiconductor device 1100, the front surface of the mesa portion 81 includes the second conductivity type regions 85 discretely provided in the Y axis direction, where the second conductivity type region 85 is surrounded by the anode region 184 exposed to the front surface of the mesa portion 81. The anode region 184 is a region in the diode portion 80, which is provided on the front surface side of the semiconductor substrate 10. For example, the anode region 184 is of the P+ type. The doping concentration of the anode region 184 of the semiconductor device 1100 is higher than the doping concentration of the anode region 84 of the semiconductor device 100.

In the diode portion 80 of the semiconductor device 1100, the front surface structure of the mesa portion 81 is similar to the front surface structure of the mesa portion 81 in the Ohmic junction region 87 of the semiconductor device 100 according to the example. A region corresponding to the Schottky junction region 88 of the semiconductor device 100 is not provided in the semiconductor device 1100.

The transistor portion 70 of the semiconductor device 1100 includes the boundary region 90 at the end of the diode portion 80 side in a top view. The boundary region 90 includes a plurality of mesa portions 71. In the boundary region 90, the front surface of the mesa portion 71 most spaced apart from the diode portion 80 includes the contact region 15 provided to extend in the Y axis direction. The front surfaces of the other mesa portions 71 of the boundary region 90 includes the second conductivity type region 85 discretely provided in the Y axis direction, where the second conductivity type region 85 is surrounded by the anode region 184 expose to the front surface of the mesa portion 71.

That is, in the boundary region 90 of the semiconductor device 1100, the front surface structure of the mesa portion 71 most spaced apart from the diode portion 80 is in common with the front surface structure of the mesa portion 71 of the boundary region 90 of the semiconductor device 100. On the other hand, the front surface structures of the other mesa portions 71 of the boundary region 90 and the mesa portions 81 of the diode portion 80 are similar to the front surface structure of the mesa portion 81 of the Ohmic junction region 87 of the semiconductor device 100. The diode portion 80 of the semiconductor device 1100 is not provided with the Schottky junction region 88 and the doping concentration of the anode region 184 is higher than the doping concentration of the anode region 84 of the semiconductor device 100, so that the total amount of holes is greater than that of the diode portion 80 of the semiconductor device 100.

From among the mesa portions 71 of the boundary region 90 of the semiconductor device 1100, assuming that the cathode region 82 is provided below the mesa portion including the second conductivity type regions 85 discretely provided in the Y axis direction, holes sneak from the contact region 15 of the transistor portion 70 into the cathode region 82 during reverse recovery of the diode portion 80. Therefore, the collector region 22 is provided below the aforementioned mesa portion to suppress holes from sneaking. That is, in the semiconductor device 1100, the boundary region 90 is formed as an invalid region to sacrifice the diode function, thereby reducing the reverse recovery loss.

The width $D_B$ of the boundary region 90 of the semiconductor device 1100 in the X axis direction is equal to or greater than 70 μm. Note that the width $D_B$ varies depending on the thickness of the semiconductor substrate 10. The width $D_B$ of the boundary region 90 of the semiconductor device 1100 in the X axis direction is greater than the width $D_B$ of the boundary region 90 of the semiconductor device 100 in the X axis direction. Further, the width $D_B$ of the boundary region 90 of the semiconductor device 1100 in the X axis direction is greater than the sum of the width $D_B$ of the boundary region 90 in the X axis direction and the width $D_S$ of the Schottky junction region 88 in the X axis direction of the semiconductor device 100.

In this manner, in the semiconductor device 100 according to the example, as compared to the semiconductor device 1100 according to the comparative example, the diode portion 80 is provided with the Ohmic junction region 87 and the Schottky junction region 88 to make the boundary region 90 which is an invalid region smaller while reducing the reverse recovery loss such that the chip area can be smaller.

Figure 3:
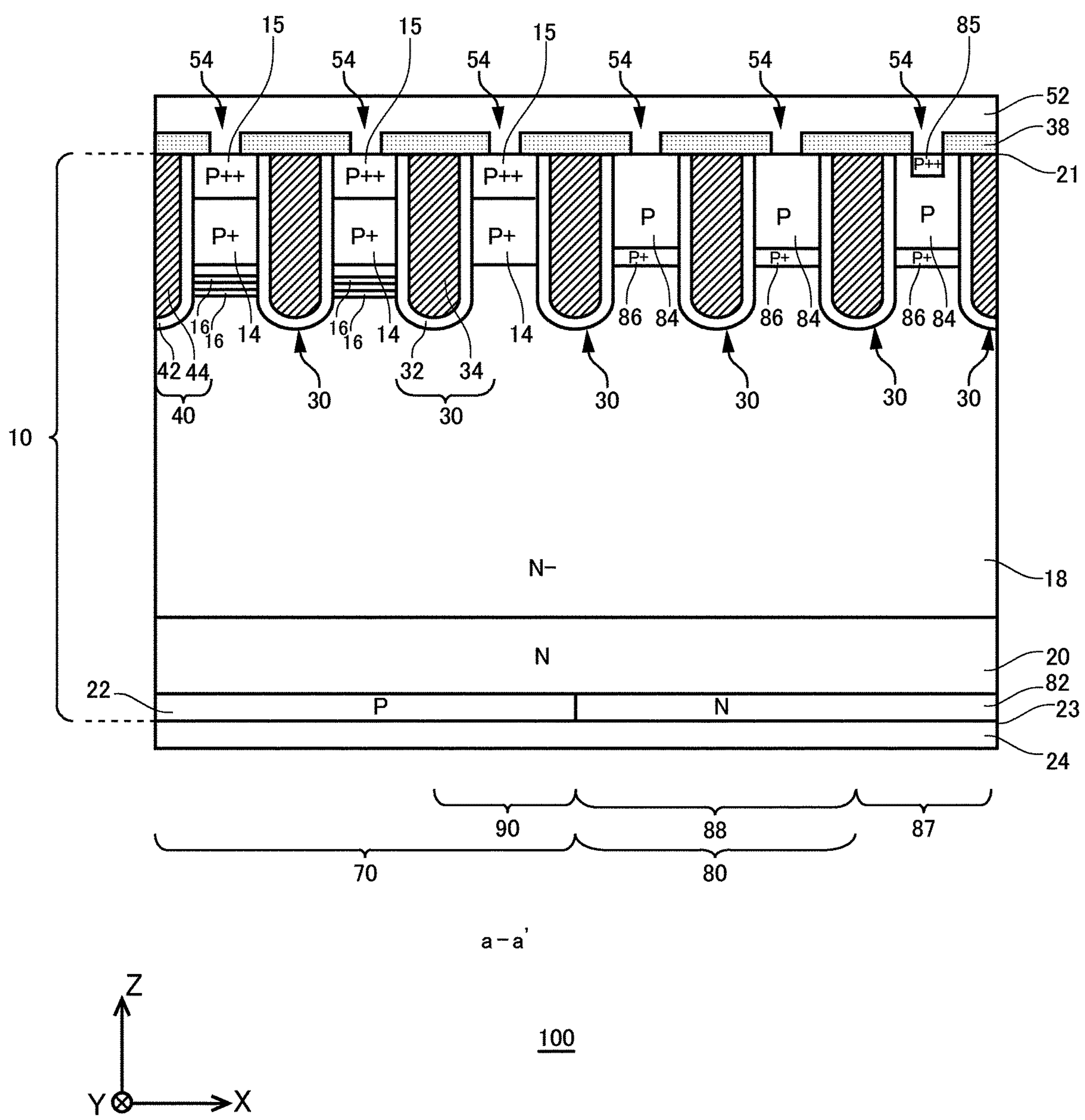
FIG. 3 is a diagram showing another example of the cross section taken along the line a-a' in FIG. 1A.

FIG. 3 is a diagram showing another example of the cross section taken along the line a-a' in FIG. 1A. The example of FIG. 3 is different from the example of FIG. 1B in the diode portion 80 provided with the reach-through prevention region 86.

The reach-through prevention region 86 is a region provided above the drift region 18 in the diode portion 80. In the present example, the reach-through prevention region 86 is of the P+ type, for example. The doping concentration of the reach-through prevention region 86 is higher than 2.5E14 $cm^{-3}$ and equal to or smaller than 9E16 $cm^{-3}$. The doping concentration of the reach-through prevention region 86 is higher than the doping concentration of the anode region 84 and lower than the doping concentration of the second conductivity type region 85. In addition, the doping concentration of the reach-through prevention region 86 is lower than the doping concentration of the base region 14.

The reach-through prevention region 86 is provided across the mesa portion 81. The reach-through prevention region 86 may be provided to be in contact with the lower end of the anode region 84. Alternatively, the reach-through prevention region 86 may also be provided below the lower end of the second conductivity type region 85 in the anode region 84.

An example of the process to form the P type region having a different doping concentration at the front surface 21 side of the semiconductor substrate 10 by ion implantation of dopants such as boron (B) from the front surface 21 of the semiconductor substrate 10 will be described. First, the reach-through prevention region 86 is formed by implanting dopants into the diode portion 80 via a mask. Then, dopants are implanted from the entire front surface 21 of the semiconductor substrate 10 to form the anode region 84 in the diode portion 80. Then, ion implantation of dopants is performed in the transistor portion 70 via a mask to form the base region 14 in the transistor portion 70. Then, ion implantation of dopants is performed in the diode portion 80 via a mask to form the second conductivity type region 85 in the diode portion 80.

In the present example, the doping concentration of the anode region 84 is lower such that the Schottky junction is formed between the anode region 84 and the emitter electrode 52 in the Schottky junction region 88, which tends to cause the depletion layer to expand to the anode region 84 during reverse recovery of the diode portion 80. Therefore, the reach-through prevention region 86 is provided to suppress expansion of the depletion layer, thereby preventing the semiconductor device 100 from breakdown.

Figure 4:
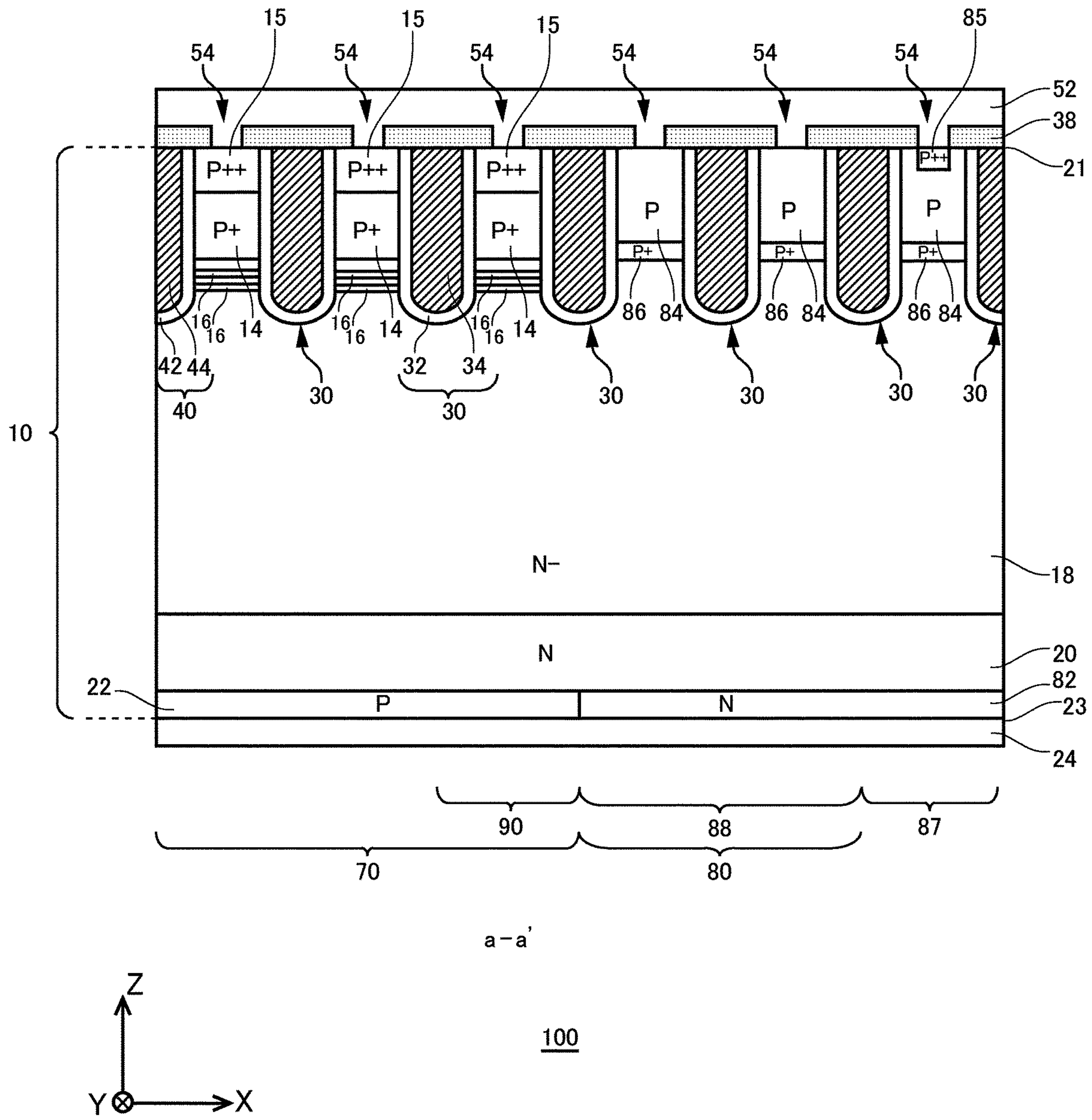
FIG. 4 is a diagram showing another example of the cross section taken along the line a-a' in FIG. 1A.

FIG. 4 is a diagram showing another example of the cross section taken along the line a-a' in FIG. 1A. The example of FIG. 4 is different from the example of FIG. 3 in the boundary region 90 provided with the accumulation region 16.

The accumulation region 16 of the present example is provided in the entire transistor portion 70 including the boundary region 90. This can further increase the IE effect to reduce the ON voltage of the transistor portion 70. In the Z axis direction, two or more stages of the accumulation regions 16 may be provided.

Figure 5:
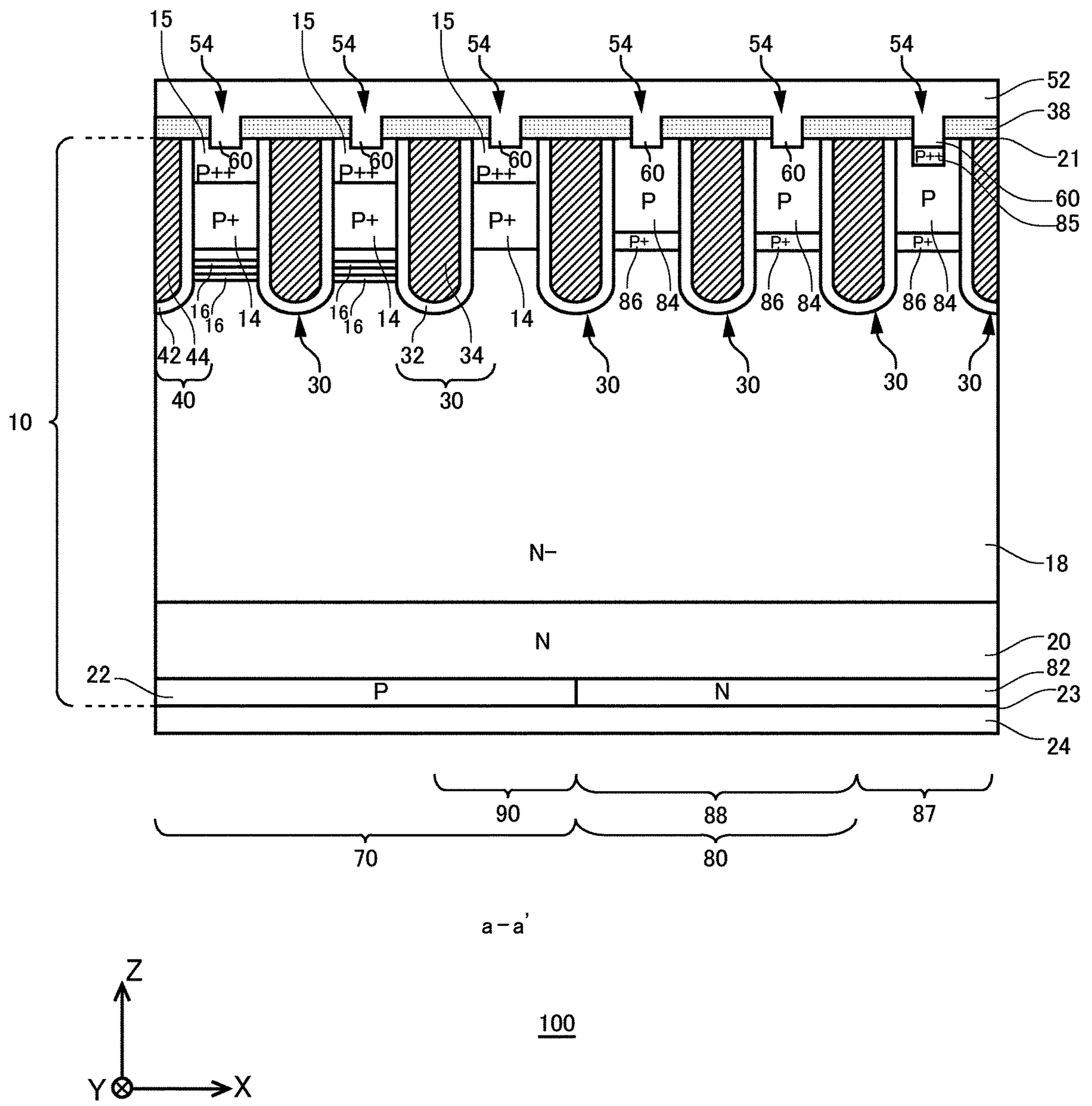
FIG. 5 is a diagram showing another example of the cross section taken along the line a-a' in FIG. 1A.

FIG. 5 is a diagram showing another example of the cross section taken along the line a-a' in FIG. 1A. The example of FIG. 5 is different from the example of FIG. 3 in the trench contact portion 60 provided below the contact hole 54.

The trench contact portion 60 is provided on the front surface 21 of the semiconductor substrate 10. The trench contact portion 60 electrically connects the emitter electrode 52 and the semiconductor substrate. The trench contact portion 60 is provided continuously from the contact hole 54. The trench contact portion 60 of the present example is provided to extend in the Y axis direction in each of the mesa portion 71 and the mesa portion 81.

The trench contact portion 60 contains a conductive material filled in the contact hole 54. A barrier metal formed of titanium, titanium compound or the like may be provided inside the trench contact portion 60 and the contact hole 54. Further, in the trench contact portion 60 and the contact hole 54, a plug formed of tungsten or the like may be provided via the barrier metal.

The trench contact portion 60 is provided to facilitate withdrawal of the minority carrier (holes, for example). This can improve the breakdown withstand capability such as a latch up withstand capability due to minority carriers.

For example, the trench contact portion 60 is formed by etching the interlayer dielectric film 38. The trench contact portion 60 has a bottom surface having a substantially planar shape. The trench contact portion 60 may have a tapered form with an inclined side wall. Alternatively, the side wall of the trench contact portion 60 may also be provided to be substantially perpendicular to the front surface 21 of the semiconductor substrate 10.

The second conductivity type region 85 may diffuse from the lower end of the trench contact portion 60 to cover at least a part of the side wall of the trench contact portion 60. The lower end of the second conductivity type region 85 may be at the same depth as or may be shallower than the lower end of the contact region 15.

In the Ohmic junction region 87, the second conductivity type regions 85 are discretely provided at the lower end of the trench contact portion 60. This can reduce the contact resistance to facilitate withdrawal of holes, thereby improving the breakdown withstand capability such as the latch up withstand capability.

While the present invention has been described by way of the embodiments, the technical scope of the present invention is not limited to the above described embodiments. It is apparent to persons skilled in the art that various alterations or improvements can be made to the above described embodiments. It is apparent from the description of the claims that embodiments added with such alterations or improvements can also be included in the technical scope of the present invention.

It should be noted that the operations, procedures, steps, stages, and the like of each process performed by an apparatus, system, program, and method shown in the claims, embodiments, or diagrams can be realized in any order as long as the order is not indicated by "prior to," "before," or the like and as long as the output from a previous process is not used in a later process. Even if the operation flow is described using phrases such as "first" or "next" in the claims, embodiments, or diagrams for convenience, it does not necessarily mean that the process must be performed in this order.

EXPLANATION OF REFERENCES

10: semiconductor substrate, 12: emitter region, 14: base region, 15: contact region, 16: accumulation region, 17: well region, 18: drift region, 20: buffer region, 21: front surface, 22: collector region, 23: back surface, 24: collector electrode, 30: dummy trench portion, 31: extending portion, 33: connecting portion, 32: dummy dielectric film, 34: dummy conductive portion, 38: interlayer dielectric film, 40: gate trench portion, 41: extending portion, 43: connecting portion, 42: gate dielectric film, 44: gate conductive portion, 50: gate metal layer, 52: emitter electrode, 54: contact hole, 55: contact hole, 56: contact hole, 60: trench contact portion, 70: transistor portion, 71: mesa portion, 80: diode portion, 81: mesa portion, 82: cathode region, 84: anode region, 85: second conductivity type region, 86: reach-through prevention region, 87: Ohmic junction region, 88: Schottky junction region, 90: boundary region, 100: semiconductor device, 184: anode region, 1100: semiconductor device

What is claimed is:

1. A semiconductor device comprising a transistor portion and a diode portion, wherein the transistor portion includes:

a plurality of trench portions provided in a semiconductor substrate;

a drift region of a first conductivity type provided in the semiconductor substrate;

a base region of a second conductivity type provided above the drift region;

an emitter region of the first conductivity type provided on a front surface of the semiconductor substrate and having a doping concentration higher than that of the drift region; and a contact region of the second conductivity type provided on the front surface of the semiconductor substrate above the base region and having a doping concentration higher than that of the base region, the diode portion includes:

the plurality of trench portions;

the drift region of the first conductivity type;

an anode region of the second conductivity type provided above the drift region and having a doping concentration lower than that of the base region; and a second conductivity type region provided on the front surface of the semiconductor substrate above the anode region and having a doping concentration higher than that of the anode region, the diode portion includes:

a Schottky junction region in which the anode region is provided on the front surface of the semiconductor substrate; and an Ohmic junction region in which the anode region and the second conductivity type region are provided on the front surface of the semiconductor substrate, wherein the second conductivity type region is discretely provided in a trench extending direction, and the doping concentration of the second conductivity type region is higher than the doping concentration of the contact region.

2. The semiconductor device according to claim 1, wherein the doping concentration of the anode region is equal to or greater than 2.5E14 $cm^{-3}$ and equal to or smaller than 1E16 $cm^{-3}$.

3. The semiconductor device according to claim 1, wherein the Schottky junction region is provided, in a top view of the semiconductor substrate, in the diode portion at an end of the transistor portion side.

4. The semiconductor device according to claim 1, wherein a width of the Schottky junction region is equal to or smaller than 70 μm in a trench arrangement direction.

5. The semiconductor device according to claim 1, wherein the Schottky junction region is not provided with the second conductivity type region.

6. The semiconductor device according to claim 1, wherein the second conductivity type region is provided to be spaced apart from a side wall of the trench portion in a mesa portion of the semiconductor substrate.

7. A semiconductor device comprising a transistor portion and a diode portion, wherein the transistor portion includes:

a plurality of trench portions provided in a semiconductor substrate;

a drift region of a first conductivity type provided above the drift region;

an emitter region of the first conductivity type provided on a front surface of the semiconductor substrate and having a doping concentration higher than that of the drift region; and a contact region of the second conductivity type provided on the front surface of the semiconductor substrate above the base region and having a doping concentration higher than that of the base region, the diode portion includes:

the plurality of trench portions;

the drift region of the first conductivity type;

an anode region of the second conductivity type provided above the drift region and having a doping concentration lower than that of the base region; and a second conductivity type region provided on the front surface of the semiconductor substrate above the anode region and having a doping concentration higher than that of the anode region, the diode portion includes:

a Schottky junction region in which the anode region is provided on the front surface of the semiconductor substrate; and an Ohmic junction region in which the anode region and the second conductivity type, wherein the diode portion includes a reach-through prevention region of the second conductivity type provided above the drift region and having a doping concentration higher than the doping concentration of the anode region and lower than the doping concentration of the second conductivity type region.

8. The semiconductor device according to claim 7, wherein the reach-through prevention region is provided to be in contact with a lower end of the anode region.

9. The semiconductor device according to claim 7, wherein the doping concentration of the reach-through prevention region is lower than the doping concentration of the base region.

10. The semiconductor device according to claim 7, wherein the doping concentration of the reach-through prevention region is higher than 2.5E14 $cm^{-3}$ and equal to or smaller than 9E16 $cm^{-3}$.

11. The semiconductor device according to claim 1, wherein the transistor portion includes a boundary region not provided with the emitter region at an end of the diode portion side in a top view of the semiconductor substrate.

12. The semiconductor device according to claim 11, wherein a width of the boundary region in a trench arrangement direction is smaller than a width of the Schottky junction region in the trench arrangement direction.

13. A semiconductor device comprising a transistor portion and a diode portion, wherein the transistor portion includes:

a plurality of trench portions provided in a semiconductor substrate;

a drift region of a first conductivity type provided in the semiconductor substrate;

a base region of a second conductivity type provided above the drift region;

an emitter region of the first conductivity type provided on a front surface of the semiconductor substrate and having a doping concentration higher than that of the drift region; and a contact region of the second conductivity type provided on the front surface of the semiconductor substrate above the base region and having a doping concentration higher than that of the base region, the diode portion includes:

the plurality of trench portions;

the drift region of the first conductivity type;

an anode region of the second conductivity type provided above the drift region and having a doping concentration lower than that of the base region; and a second conductivity type region provided on the front surface of the semiconductor substrate above the anode region and having a doping concentration higher than that of the anode region, the diode portion includes:

a Schottky junction region in which the anode region is provided on the front surface of the semiconductor substrate; and an Ohmic junction region in which the anode region and the second conductivity type region are provided on the front surface of the semiconductor substrate, wherein the transistor portion includes a boundary region not provided with the emitter region at an end of the diode portion side in a top view of the semiconductor substrate, and the width of the boundary region in the trench arrangement direction is equal to or greater than 1.7 μm and equal to or smaller than 2.3 μm.

14. The semiconductor device according to claim 11, wherein, in a top view of the semiconductor substrate, the contact regions and the base regions are alternately provided in the boundary region in a trench extending direction.

15. The semiconductor device according to claim 11, wherein the transistor portion includes an accumulation region of the first conductivity type provided below the base region and having a doping concentration higher than that of the drift region.

16. The semiconductor device according to claim 15, wherein the accumulation region is not provided in the boundary region.

17. The semiconductor device according to claim 1, comprising a trench contact portion provided on the front surface of the semiconductor substrate, wherein the second conductivity type region is discretely provided at a lower end of the trench contact portion.

18. The semiconductor device according to claim 1, wherein the semiconductor substrate is not provided with a lifetime control region including a lifetime killer in the front surface side compared to a center in a depth direction of the semiconductor substrate.

19. The semiconductor device according to claim 7, comprising a trench contact portion provided on the front surface of the semiconductor substrate, wherein the second conductivity type region is discretely provided at a lower end of the trench contact portion.

* * * * *